US008981972B2

(12) United States Patent
Shen et al.

(10) Patent No.: US 8,981,972 B2
(45) Date of Patent: Mar. 17, 2015

(54) BACKGROUND CALIBRATION OF ADC REFERENCE VOLTAGE DUE TO INPUT SIGNAL DEPENDENCY

(71) Applicants: Junhua Shen, Cambridge, MA (US); Ronald A. Kapusta, Bedford, MA (US); Edward C. Guthrie, Charlestown, MA (US)

(72) Inventors: Junhua Shen, Cambridge, MA (US); Ronald A. Kapusta, Bedford, MA (US); Edward C. Guthrie, Charlestown, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/028,767

(22) Filed: Sep. 17, 2013

(65) Prior Publication Data
US 2014/0266847 A1 Sep. 18, 2014

Related U.S. Application Data

(60) Provisional application No. 61/785,167, filed on Mar. 14, 2013.

(51) Int. Cl.
| H03M 1/06 | (2006.01) |
| H03M 1/38 | (2006.01) |
| H03M 1/10 | (2006.01) |
| H03M 1/16 | (2006.01) |
| H03M 1/44 | (2006.01) |
| H03M 1/46 | (2006.01) |

(52) U.S. Cl.
CPC .............. *H03M 1/38* (2013.01); *H03M 1/1019* (2013.01); *H03M 1/164* (2013.01); *H03M 1/44* (2013.01); *H03M 1/46* (2013.01)
USPC ........................................... 341/118; 341/155

(58) Field of Classification Search
USPC .................................. 341/155, 120, 118, 122
See application file for complete search history.

(56) References Cited

U.S. PATENT DOCUMENTS

| 5,047,772 | A | | 9/1991 | Ribner |
| 5,319,370 | A | | 6/1994 | Signore et al. |
| 6,084,394 | A | * | 7/2000 | Windsheimer et al. ....... 324/130 |
| 7,495,589 | B1 | | 2/2009 | Trifonov et al. |
| 7,710,303 | B2 | * | 5/2010 | Wojewoda et al. ........... 341/155 |
| 8,451,154 | B2 | * | 5/2013 | Erdmann et al. .............. 341/120 |
| 8,593,315 | B2 | * | 11/2013 | Yamase et al. ................ 341/118 |
| 8,624,765 | B2 | * | 1/2014 | Watanabe .................... 341/122 |

OTHER PUBLICATIONS

C-Y Chen et al., "A Low Power 6-bit Flash ADC with Reference Voltage and Common-Mode Calibration," IEEE Journal of Solid-State Circuits, vol. 44, No. 4, Apr. 2009, pp. 1041-1046.

(Continued)

*Primary Examiner* — Brian Young
(74) *Attorney, Agent, or Firm* — Kenyon & Kenyon LLP (57) ABSTRACT

Embodiments of the present invention may provide an analog-to-digital converter (ADC) system. The ADC system may include an analog circuit to receive an input signal and a reference voltage, and to convert the input signal into a raw digital output. The analog circuit may include at least one sampling element to sample the input signal during a sampling phase and reused to connect to the reference voltage during a conversion phase, and an ADC output to output the raw digital output. The ADC system may also include a digital processor to receive the raw digital output and for each clock cycle, to digitally correct reference voltage errors in the analog-to-digital conversion.

24 Claims, 8 Drawing Sheets

(56) References Cited

OTHER PUBLICATIONS

J. Ming et al., "An 8-bit 80-Msample/s Pipelined Analog-to-Digital Converter with Background Calibration," IEEE Journal of Solid-State Circuits, vol. 36, No. 10, Oct. 2001, pp. 1489-1497.

A. Larsson et al., "A Background Calibration Scheme for Pipelined ADCs Including Non-linear Operational Amplifier Gain and Reference Error Correction," Proceedings of the IEEE International SOC Conference, Sep. 2004, pp. 37-40.

R. Yun et al., "LMS-based Calibration of Pipelined ADCs Including Linear and Nonlinear Errors," Proceedings of the IEEE 18th European Conference on Circuit Theory and Design, Aug. 2007, pp. 348-351.

Extended European Search Report issued in counterpart European application No. 14157547.2, communication dated Nov. 7, 2014.

\* cited by examiner

BACKGROUND CALIBRATION OF ADC REFERENCE VOLTAGE DUE TO INPUT SIGNAL DEPENDENCY

CROSS-REFERENCE TO RELATED APPLICATION

This application claims the benefit of priority afforded by provisional U.S. Patent Application Ser. No. 61/785,167, filed Mar. 14, 2013, the content of which is incorporated herein.

BACKGROUND

The present invention relates to analog-to-digital converters (ADCs), in particular to reference voltage error correction therein.

ADCs convert an input analog signal to a digital representation (e.g., digital word). Typically, ADCs use a reference voltage in their conversion process. For example, in successive approximation register (SAR) ADCs, reference voltages are used in bit trials to calculate bit values of the digital word. However, reference voltage sources often include non-idealities that can corrupt the conversion.

Pure analog approaches are conventionally used to generate reference voltages that are ideally process, supply voltage and temperature (PVT) independent. However, three main issues arise from pure analog approaches. First, high power consumption and complexity associated with these approaches negate most of the benefits provided from them. Second, accurate PVT tracking may be difficult to impossible as reference requirements are getting more stringent in today's applications. Third, regardless of precision of the reference voltage generation, non-idealities are prone to enter the system. For example, reference voltage often depends on the input signal in many ADC designs, which introduce reference voltage errors. Theoretically, it may be possible to eliminate Vin dependency if sufficient settling time between cycles is allowed; however, allowing this much time can cause significant delays and other errors for high speed, high accuracy ADCs.

One time calibration, such as calibration after manufacturing time or powering up, can alleviate some errors introduced by process variation but cannot compensate for other errors, including dynamic cycle-to-cycle errors. A separate error correction path, such as a feedback loop, using a separate highly accurate ADC to measure errors can be used to correct slow errors, for example supply and/or temperature induced errors. However, separate ADC error correction paths must use expensive ADCs to measure these slow errors, and still they are not fast enough to correct faster errors such as reference voltage errors due to input signal dependency, because these errors change cycle to cycle.

Therefore, the inventors recognized a need in the art for fast reference voltage error corrections in ADCs without an extra ADC that can dynamically correct such errors cycle to cycle.

DETAILED DESCRIPTION

Embodiments of the present invention may provide an analog-to-digital converter (ADC) system. The ADC system may include an analog circuit to receive an input signal and a reference voltage, and to convert the input signal into a raw digital output. The analog circuit may include at least one sampling element to sample the input signal during a sampling phase and reused to connect to the reference voltage during a conversion phase, and an ADC output to output the raw digital output. The ADC system may also include a digital processor to receive the raw digital output and for each clock cycle, to digitally correct reference voltage errors in the analog-to-digital conversion.

Figure 1A:
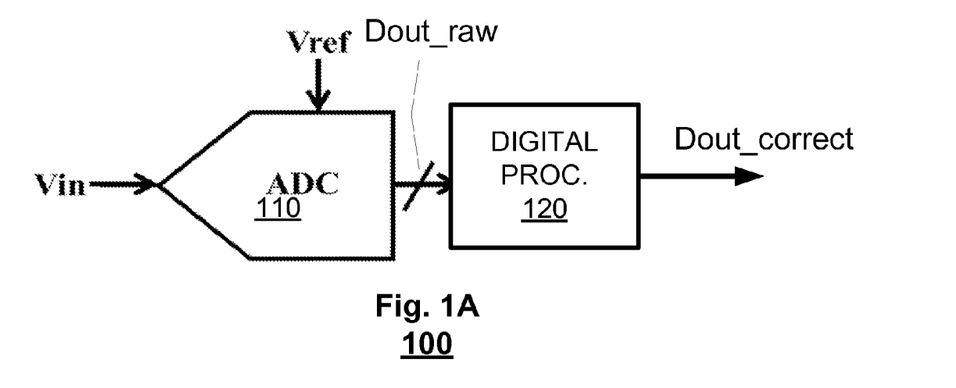
FIG. 1A illustrates an ADC system according to an embodiment of the present invention.

FIG. 1A is an ADC system 100 with reference voltage error correction according to an embodiment of the present invention. The ADC system 100 may include an ADC 110 and a digital processor 120. The ADC 110 may receive an input analog signal, Vin, and reference voltage, Vref. Based on these input signals, the ADC 110 may convert Vin to a generate a raw digital output signal, Dout_raw.

However, the reference voltage Vref may introduce errors into the conversion due to input signal dependencies that are passed onto the raw digital output signal, Dout_raw. For example, the ADC 110 may include at least one sampling element that is used to sample Vin during a sampling phase and also used to connect to Vref in the conversion phase. The reuse of the sampling element may cause the input signal dependent errors in the reference voltage. Hence, the reference voltage error may vary cycle to cycle. The reference voltage may be generated using a variety of techniques, each introducing input signal dependency errors in the reference voltage.

Figure 1B:
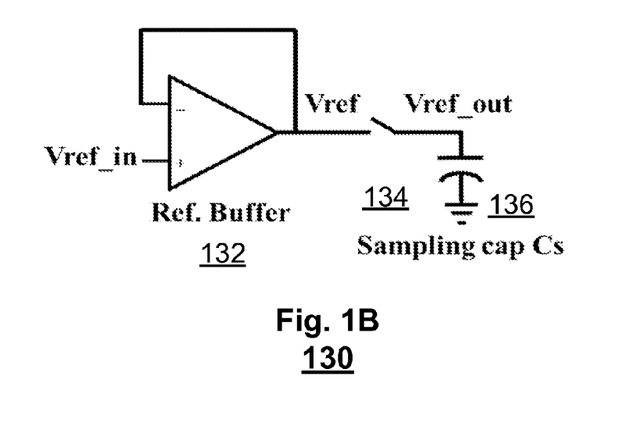
FIG. 1B illustrates a reference voltage generation system according to an embodiment of the present invention.

FIG. 1B is reference voltage generation system 130 using a reference buffer that may be used in conjunction with the ADC system 100 of FIG. 1A according to an embodiment of the present invention. The reference voltage generation system 130 may include a reference buffer 132, a switch 134, and a sampling capacitor(s) 136. The sampling capacitor(s) 136 may be provided as one or more capacitors. The reference buffer 132 may be coupled to the switch 134 to drive the sampling capacitor(s) 136. The switch 134 may selectively connect the reference buffer 132 output, Vref, to sampling capacitor(s) 136. Prior to receiving a charge by the reference buffer 132 in the form of Vref, the sampling capacitor(s) 136 may already have an input voltage Vin stored within. Thus, sampling capacitor(s) 136 may be reused by both the input voltage and reference voltage leading to input signal dependency errors in the reference voltage.

Figure 1C:
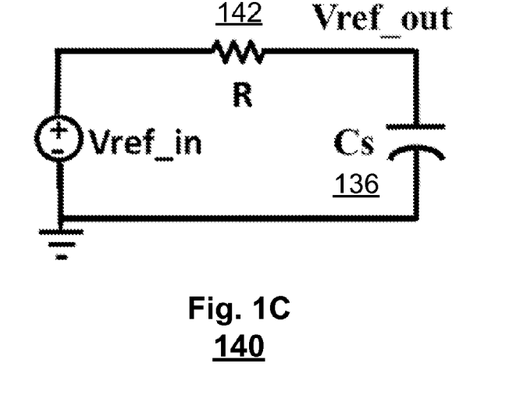
FIG. 1C illustrates an RC model of a reference voltage generation system according to an embodiment of the present invention.

FIG. 1C illustrates a simplified RC model 140 of the reference voltage generation system 130 in FIG. 1B. The RC model 140 may include a reference voltage source Vref_in, a resistor 142, and sampling capacitor(s) 136. The resistor 142 may represent the output impedance of the reference buffer 132, switch 134, and other circuit elements of the reference voltage generation system 130. The charging process of sampling capacitor(s) 136 may be expressed as:

$$Vref\_out=Vref\_in+(Vin-Vref\_in)\exp(-t/\tau), \qquad (1)$$

where τ is the time constant corresponding to RCs and t is a time variable. Equation (1) shows that the effective connected to reference voltage Vref_out may be a function of Vin.

Figure 1D:
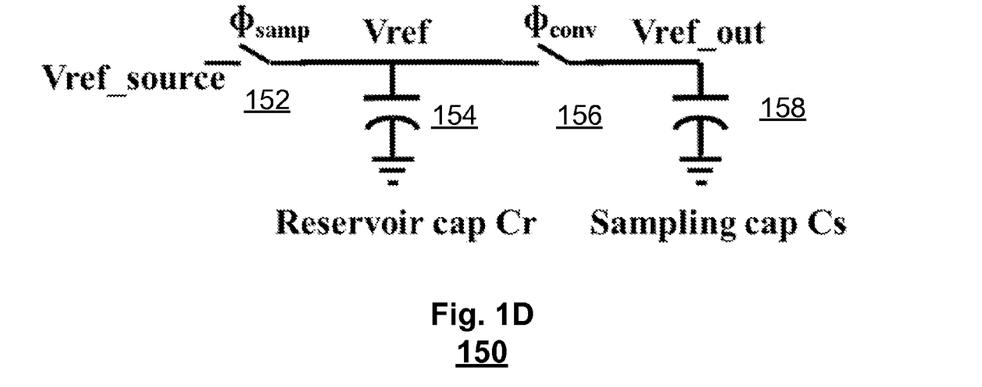
FIG. 1D illustrates a reference voltage generation system according to an embodiment of the present invention.

FIG. 1D is reference voltage generation system 150 using a reservoir capacitor that may be used in conjunction with the ADC system 100 of FIG. 1A according to another embodiment of the present invention. The reference voltage generation system 150 may include a sampling switch (φsamp) 152, a reservoir capacitor (Cr) 154, a conversion switch (φconv) 156, and sampling capacitor(s) 158. The sampling switch 152 may selectively couple a Vref_source 152 to the reservoir capacitor 154. Also, the reservoir capacitor 154 may be a large capacitor sufficient to hold large amount of reference voltage charge. The conversion switch 156 may selectively couple the reservoir capacitor(s) 154 to the sampling capacitor(s) 158 to transfer charges from reservoir capacitor 154 to the sampling capacitor(s) 158. The sampling capacitor(s) 158 may already have an input voltage Vin stored within before getting charged by the reservoir capacitor 154, Vref. Thus, sampling capacitor(s) 158 may be reused by both the input voltage and reference voltage leading to input signal dependency errors in the reference voltage. Here, the charging process of sampling capacitor(s) 158 may be expressed as:

$$Vref\_out=((Cr*Vref)+(Cs*Vin))/(Cr+Cs), \qquad (2)$$

where Cr is the capacitance of the reservoir capacitor and Cs is the capacitance of the sampling capacitor. Equation (2) shows that the effective sampled reference voltage Vref_out may be a function Vin. FIGS. 1B-1D depict input signal dependency of various reference voltage generation systems for illustration purposes only, and other reference voltage generation systems may also be used.

Returning to FIG. 1A, the digital processor 120 may correct reference voltage errors in the ADC 110. The digital processor 120 may receive the ADC 110 raw digital output signal, Dout_raw. The digital processor 120 may be implemented as a microcontroller, a microprocessor, a digital signal processor, etc. The digital processor 120 may digitally calibrate and correct the reference voltage error in Dout_raw each cycle thereby generating Dout_correct, which is the digital output signal without (or reduced) reference voltage errors. The digital processor 120 may execute a correction algorithm based on the specific architecture of the ADC 110 and bit weights. The correction algorithm may be pre-stored and executed by the digital processor 120 every conversion/clock cycle. Each cycle's bit decisions may be a variable input for the correction algorithm. The correction algorithm may take into account bit weights of ADC 110 elements. Embodiments of the correction algorithm are explained below in further detail.

Figure 2:
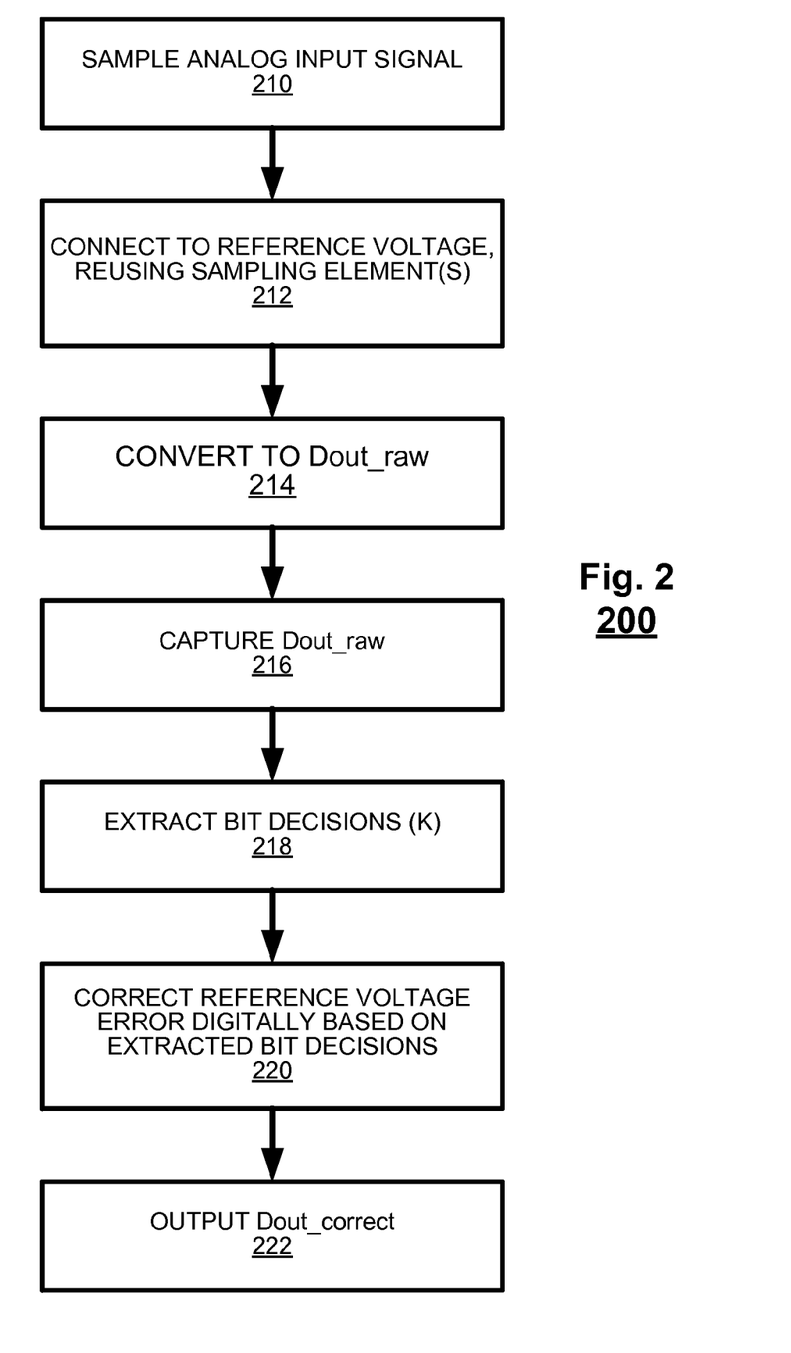
FIG. 2 illustrates a process flow for reference voltage correction according to an embodiment of the present invention.

FIG. 2 is a simplified process flow for reference voltage error correction in an ADC system to an embodiment of the present invention. For example, analog portions of process 200 may be performed by the ADC 110 of FIG. 1A and digital portions of process 200 may be performed by the digital processor 120 of FIG. 1A. Further, the process 200 may be performed each conversion cycle. In step 210, an input analog signal to be converted may be sampled by an ADC. For example, the input signal may be sampled by sampling capacitor(s) in the ADC. In step 212, a reference voltage used in the input signal conversion may be connected to the ADC. Here, at least one sampling element that was previously used to sample the input signal may be reused for the reference voltage connecting. Thus, input signal dependency errors may be introduced into the reference voltage.

In step 214, the ADC may convert the input signal using the reference voltage and thereby may generate raw digital output, Dout_raw. Dout_raw may contain errors due to the reference voltage errors. The conversion may be a SAR conversion, pipeline conversion, etc. In step 216, Dout_raw may be captured by a digital processor. In step 218, relevant bit decisions (k) may be extracted from Dout_raw. At least one bit decision may be associated with the sampling element(s) that was reused for both input signal sampling and reference voltage connecting.

In step 220, the reference voltage errors in Dout_raw may be corrected digitally based on the extracted bit decisions (k). The reference voltage correction may be performed by applying weight totals of the sampling elements. For example, actual total weights corresponding to the digital output, referred to as w_tot, may be expressed as:

$$w\_tot=w\_eff[n-1:0]\times b[n-1:0]', \qquad (3)$$

where w_eff[n−1:0] are bit weights of the conversion, b[n−1:0] are digital output bits, and b[n−1:0]' is the transpose of b[n−1:0]. Also, effective bit weights may be functions of Vin, Vref, and weights of reference elements w_ele[n−1:0], which can be expressed as:

$$w\_eff[k]=f(Vin,Vref,w\_ele[n-1:0]), \qquad (4)$$

where k is between 0 to n−1 and corresponds to the bit decisions in the respective cycle, w_ele [n−1:0] is an element weight, and the function f( ) is design architecture specific. For example, different SAR ADCs may each have a unique f( ) depending on their architectures, different piplened ADCs may each have a unique f( ) depending on their architectures, etc. Therefore, f( ) may be known and pre-stored. Further, total weight w_tot may also be a function of Vin and Vref, and may be expressed as:

$$w\_tot=Vin/Vref\_id*2^n, \qquad (5)$$

The weights of the reference elements w_ele[n−1:0] may also be known and pre-stored. Thus, using equations (3), (4), and (5) with the variable k received from the instant digital output Dout_raw, reference voltage error correction may be performed in the form of calculating w_tot and, thus, generating Dout_correct. In step 222, Dout_correct may be outputted. Dout_correct may be free of (or have reduced) reference voltage errors.

Figure 3:
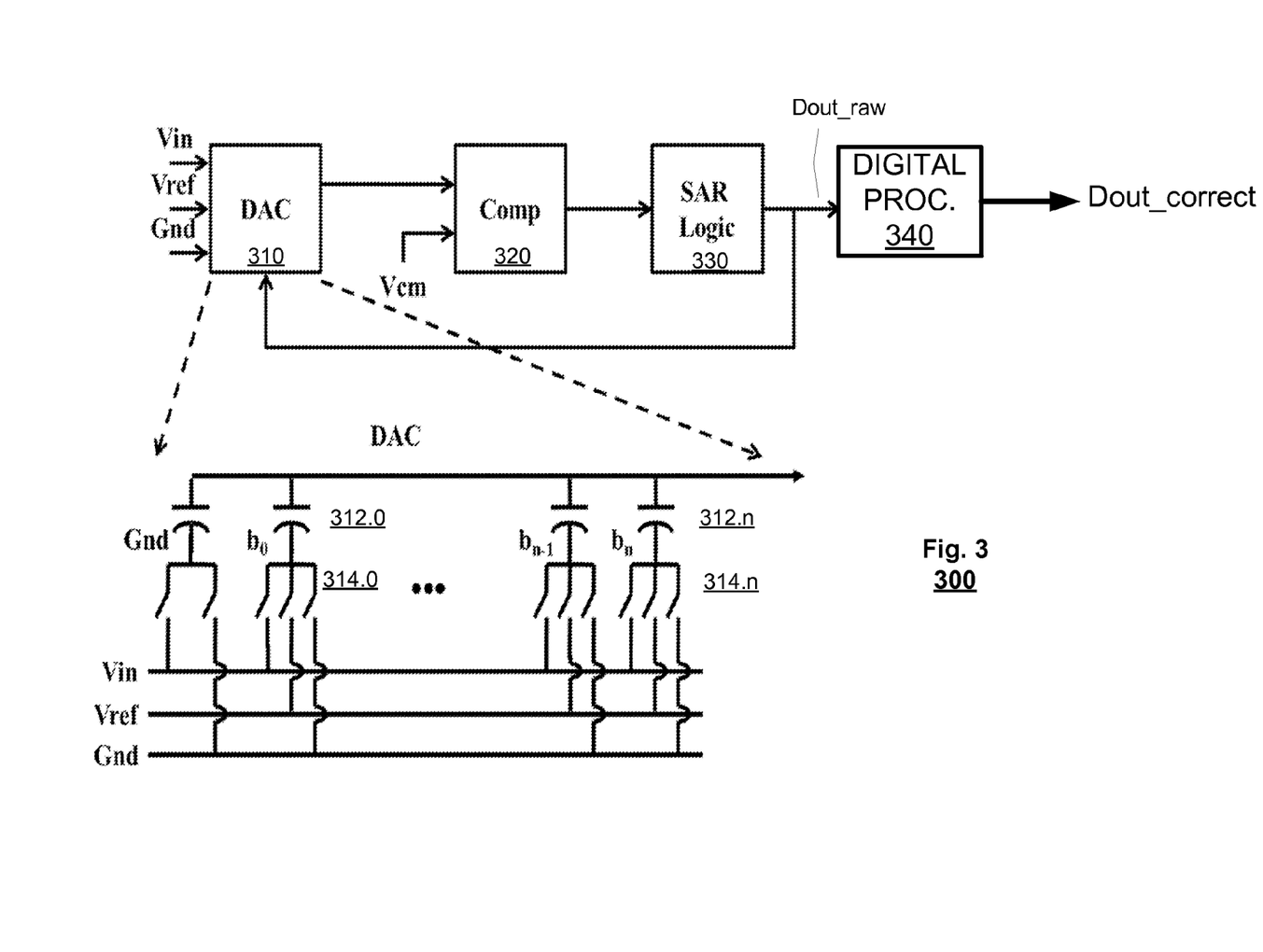
FIG. 3 illustrates a SAR ADC system according to an embodiment of the present invention.

Reference voltage correction techniques described herein may be implemented in conjunction with a variety of different ADC architectures. FIG. 3 is a SAR ADC system 300 with reference voltage error correction according to an embodiment of the present invention. The SAR ADC system 300 may include a digital-to-analog converter (DAC) 310, a comparator 320, a SAR logic 330, and a digital processor 340. The DAC 310 may receive an input analog signal (Vin), a reference voltage (Vref), and a ground voltage (GND). The DAC 310 may include shared input signal and reference voltage capacitors. For example, the DAC 310 may include sampling capacitors 312.0-312.n and corresponding sets of switches 314.0-314.n to selectively couple either Vin, Vref, or Gnd to the sampling capacitors 312.0-312.n.

DAC 310 may include sampling capacitors 312.0-312.n and corresponding sets of switches 314.0-314.n to selectively couple either Vin, Vref, or Gnd to the sampling capacitors 312.0-312.n. During a conversion phase, the sampling capacitors 312.0-312.n may be either connected to Vref or Gnd. The reuse of the sampling capacitors 312.0-312.n may cause input signal dependent errors in the reference voltage. Therefore, the reference voltage error may vary cycle to cycle. The reference voltage Vref may be generated by reference buffers, reservoir capacitor, or the like as described herein.

The comparator 320 may receive the output of the DAC 310 as one input and Vcm as the other input for comparison for bit trials in the digital word conversion cycle. The SAR logic 330 may receive the comparison output and decide whether each bit trial results in a '0' or '1'. Compiling the bit decisions, the SAR logic 330 may generate raw digital output signal, Dout_raw.

The digital processor 340 may receive Dout_raw. The digital processor 340 may be implemented as a microcontroller, a microprocessor, a digital signal processor, etc. The digital processor 340 may digitally calibrate and correct the reference voltage error in Dout_raw each cycle thereby generating Dout_correct, which is the digital output signal without (or reduced) reference voltage errors. The digital processor 340 may execute a correction algorithm based on the specific architecture of the ADC (e.g., DAC 310) and bit weights. The correction algorithm may be pre-stored and executed by the digital processor 340 every conversion/clock cycle as described herein (e.g., process 200 of FIG. 2).

Figure 4:
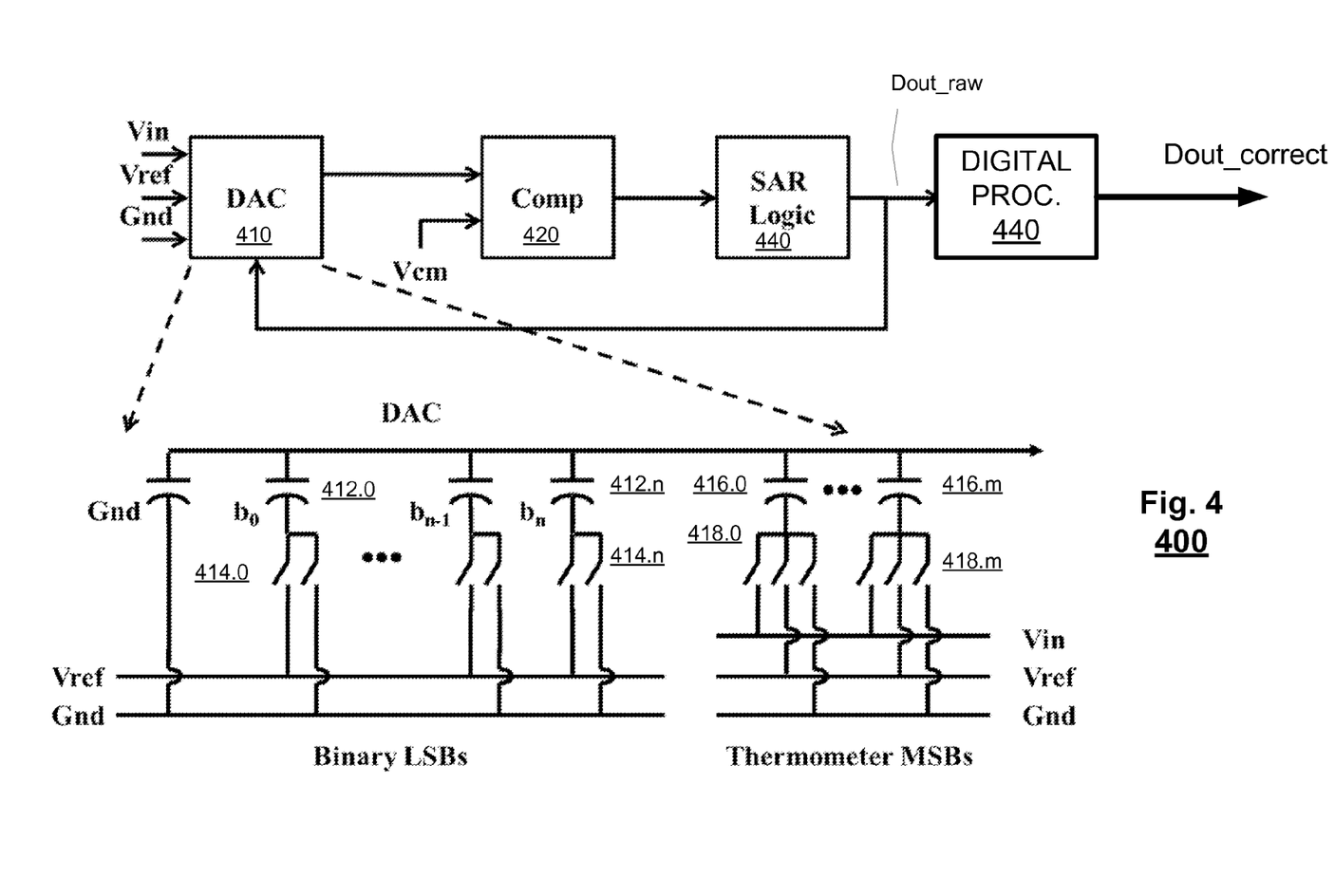
FIG. 4 illustrates a SAR ADC system according to an embodiment of the present invention.

FIG. 4 is another SAR ADC system 400 with reference voltage error correction according to an embodiment of the present invention. SAR ADC system 400 may include partially shared input signal and reference voltage capacitors. The SAR ADC system 400 may include a DAC 410, a comparator 420, a SAR logic 430, and a digital processor 440. The DAC 410 may receive an input analog signal (Vin), and a reference voltage (Vref), and a ground voltage (GND). The DAC 410 may include shared input signal and reference voltage capacitors. In an embodiment, The DAC 410 may include two sets of capacitors—LSB capacitors 412.0-412.n and MSB capacitors 416.0-416.m. LSB capacitors 412.0-412.n may be selectively coupled to Vref or Gnd by sets of switches 414.0-414.n. LSB capacitors 412.0-412.n may not be shared by the input signal. MSB capacitors 416.0-416.m, on the other hand, may be selectively coupled to Vref, Gnd, and Vin by sets of switches 418.0-418.m. MSB capacitors 416.0-416.m, unlike the LSB capacitors 412.0-412.n, may be shared by the reference voltage and input signal.

For example, during a sampling phase, the input signal Vin may be sampled onto MSB capacitors 416.0-416.m. During a conversion phase, the MSB capacitors 416.0-416.m and LSB capacitors 412.0-412.n may be either connected to Vref or Gnd. The reuse of the MSB capacitors 416.0-416.m may cause input signal dependent errors in the reference voltage. Therefore, the reference voltage error may vary cycle to cycle. The reference voltage Vref may be generated by reference buffers, reservoir capacitor, or the like as described herein.

The comparator 420 may receive the output of the DAC 410 as one input and Vcm as the other input for comparison for bit trials in the digital word conversion cycle. The SAR logic 430 may receive the comparison output and decide whether each bit trial results in a '0' or '1'. Compiling the bit trials, the SAR logic 443 may generate raw digital output signal, Dout_raw.

The digital processor 440 may receive Dout_raw. The digital processor 440 may be implemented as a microcontroller, a microprocessor, a digital signal processor, etc. The digital processor 440 may digitally calibrate and correct the reference voltage error in Dout_raw each cycle thereby generating Dout_correct, which is the digital output signal without (or reduced) reference voltage errors. The digital processor 440 may execute a correction algorithm based on the specific architecture of the ADC (DAC 410) and bit weights. The correction algorithm may be pre-stored and executed by the digital processor 440 every conversion/clock cycle as described herein (e.g., process 200 FIG. 2 or process 700 of FIG. 7 discussed below).

Figure 5:
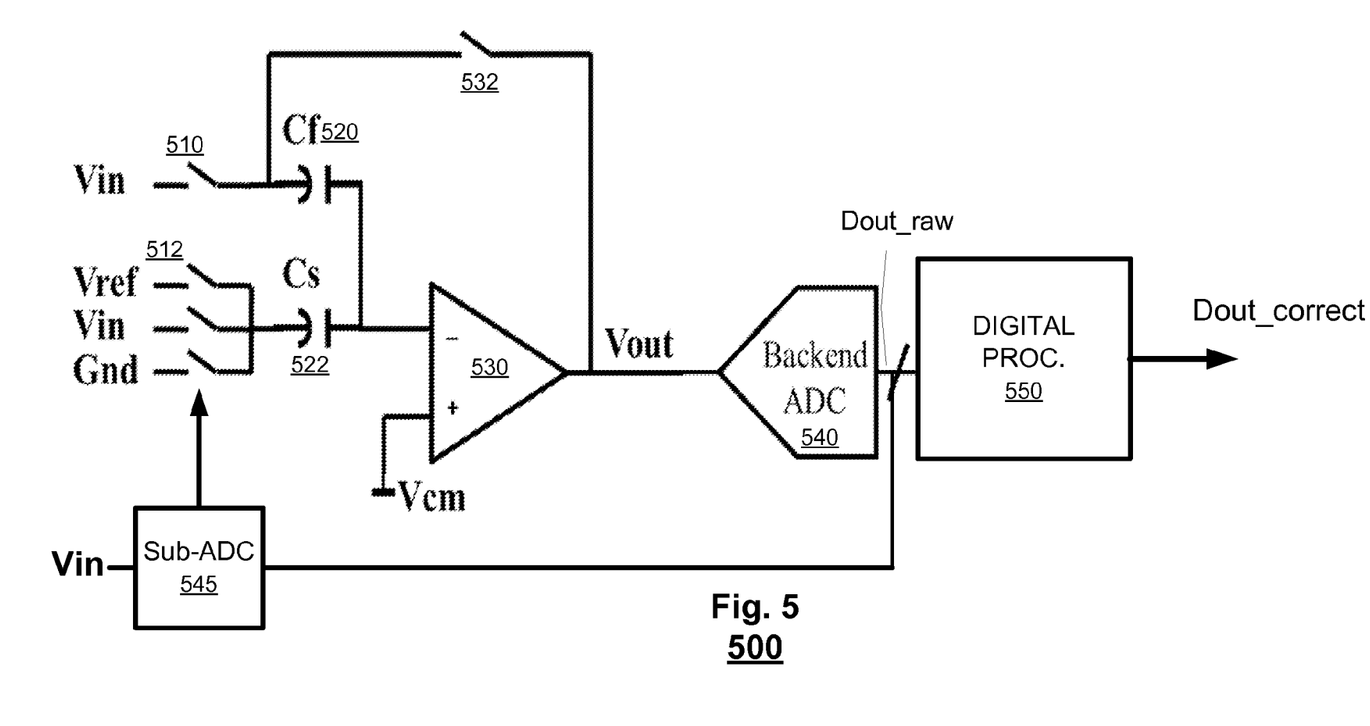
FIG. 5 illustrates a pipelined ADC system according to an embodiment of the present invention.

FIG. 5 is a pipelined ADC system 500 with reference voltage error correction according to an embodiment of the present invention. The pipelined ADC system 500 may include an analog section and a digital section. The analog section may receive an input analog signal (Vin), and a reference voltage (Vref), and a ground voltage (GND). The analog section may include switches 510, 512, 532 and sampling capacitors 520, 522. In this embodiment, the capacitor Cf 520 may receive only Vin and may not be shared by Vref. On the other hand, the capacitor Cs 522 may selectively receive Vin, Vref, or Gnd, and may be shared by the input signal Vin and Vref. Although this embodiment shows partially shared sampling elements, fully shared sampling elements in a piplelined ADC may also be implemented. The analog section may also include a first stage, including a comparator 530, switches 510, 512, 532, sampling capacitors 520, 522, and a sub-ADC 545, and a backend ADC 540. The first stage sub-ADC 545 and backend ADC 540 may generate a raw digital output signal, Dout_raw.

In the digital section, the digital processor 550 may receive Dout_raw. The digital processor 550 may be implemented as a microcontroller, a microprocessor, a digital signal processor, etc. The digital processor 550 may digitally calibrate and correct the reference voltage error in Dout_raw each cycle thereby generating Dout_correct, which is the digital output signal without (or reduced) reference voltage errors. The digital processor 550 may execute a correction algorithm based on the specific architecture of the ADC and bit weights. The correction algorithm may be pre-stored and executed by the digital processor 550 every conversion/clock cycle as described herein (e.g., process 200 of FIG. 2 or process 700 of FIG. 7 discussed below).

Figure 6:
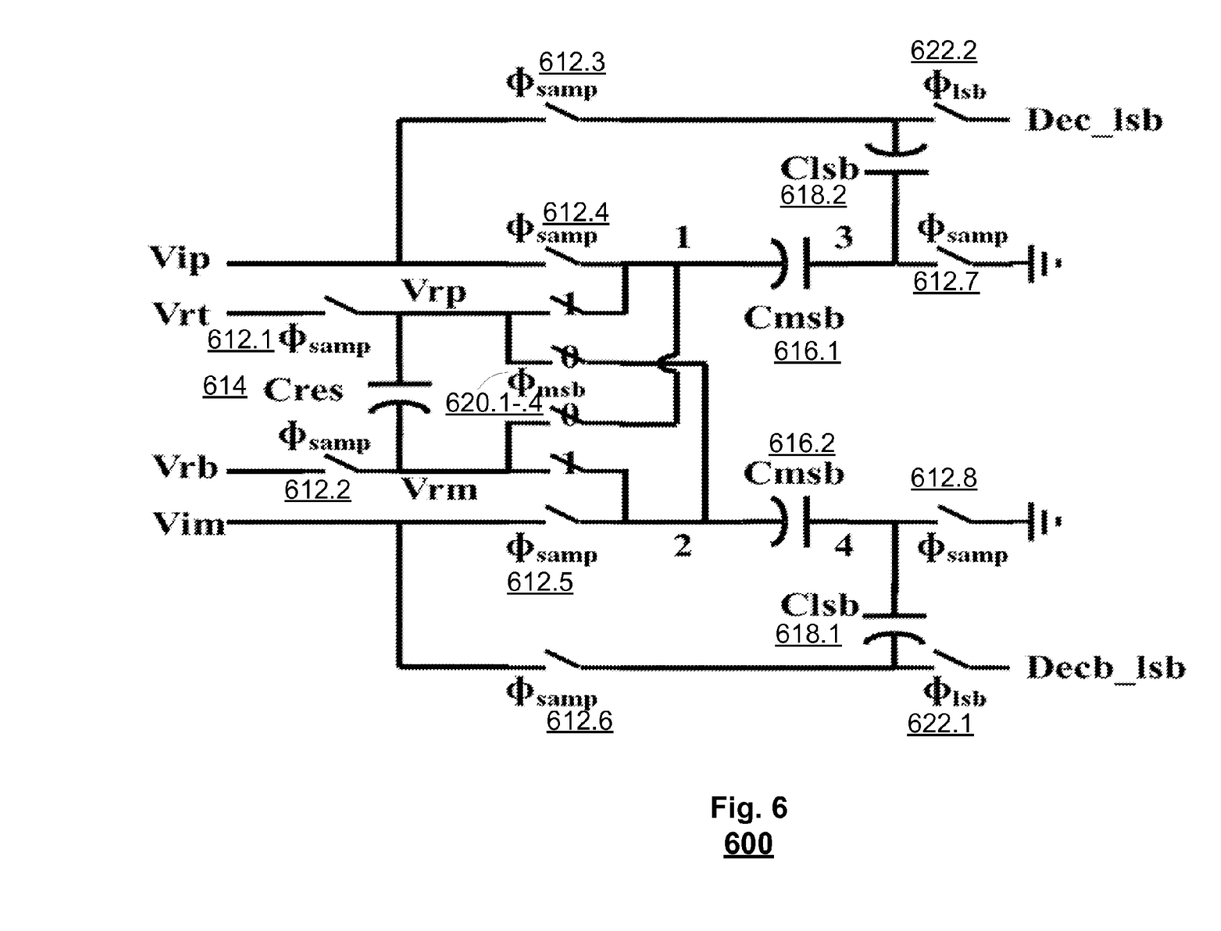
FIG. 6 illustrates a DAC of a SAR ADC system according to an embodiment of the present invention.

FIG. 6 depicts a DAC 600 in a partially shared SAR ADC according to an embodiment of the present invention. The DAC 600 illustrates 1-bit MSB and LSBs for simplicity. The DAC 600 may include differential input signals Vip and Vin, and reference voltage depicted as top Vrt and bottom Vrb. The DAC 600 may include sampling switches (φsamp) 612.1-612.8, a reservoir capacitor (Cres) 614, MSB sampling capacitors 616.1, 616.2, LSB sampling capacitors 618.1, 618.2, MSB conversion switches (φmsb) 620.1-620.4, and LSB conversion switches (φlsb) 622.1, 622.2. The MSB sampling capacitors 616.1, 616.2 may be shared by the input signal and reference voltage. Operation of DAC 600 is explained below in further detail.

Figure 7:
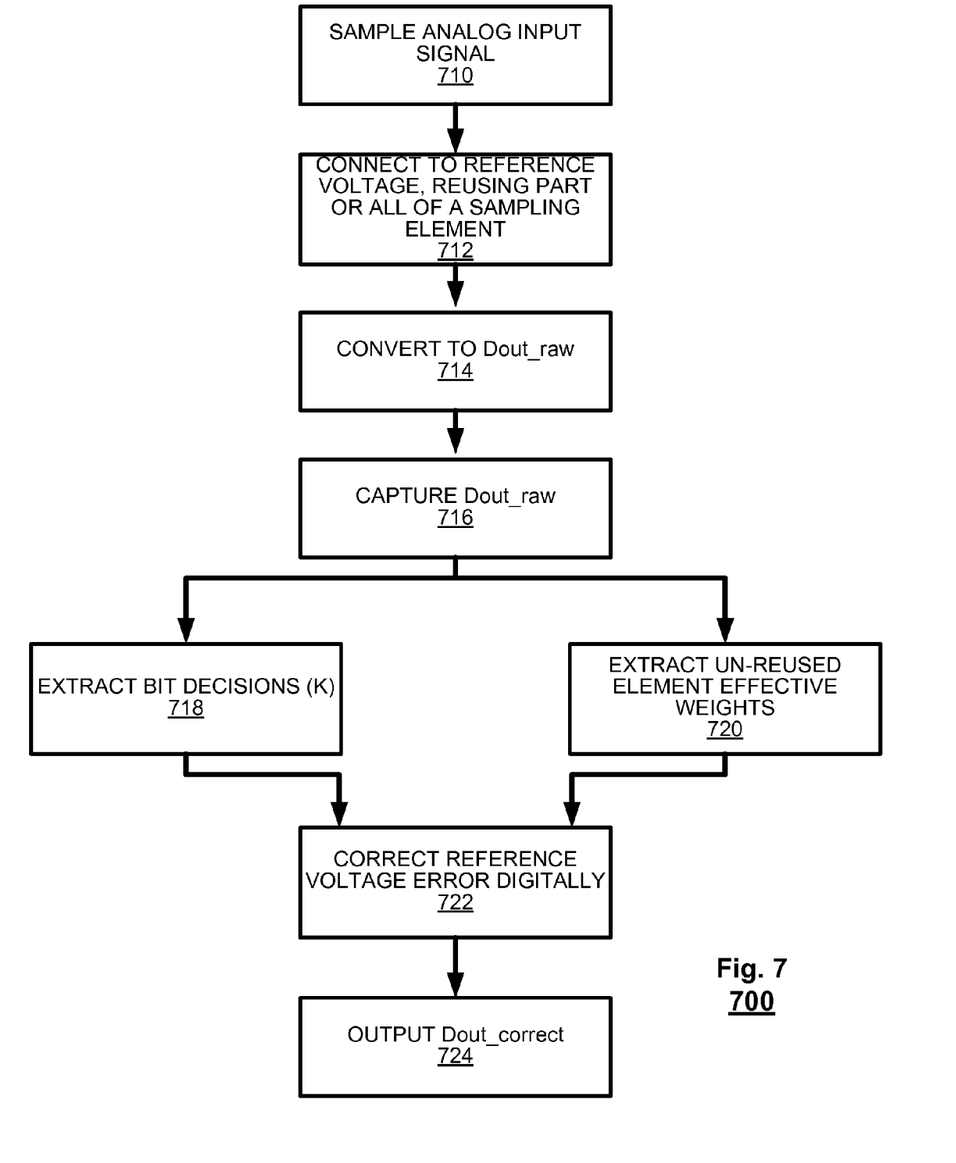
FIG. 7 illustrates a process flow for reference voltage correction according to an embodiment of the present invention.

FIG. 7 is a simplified process flow for reference voltage error correction in an ADC system to an embodiment of the present invention. The process 700 may be performed each conversion cycle for shared sampling elements in an ADC. In step 710, an input analog signal to be converted may be sampled by an ADC. For example, the input signal may be sampled by sampling capacitor(s) in the ADC. For example, in DAC 600 of FIG. 6 example, the differential input signals Vip and Vim may be sampled onto the MSB capacitors 616.1, 616.2 and LSB capacitors 618.1, 618.2 during the sampling phase. Further, an ideal reference voltage may be connected to reservoir capacitor Cres 614.

In step 712, a reference voltage used in the input signal conversion may be connected to the ADC. Here, at least one sampling element that was previously used to sample the input signal may be reused for the reference voltage connecting. Thus, input signal dependency errors may be introduced into the reference voltage. For example, in DAC 600 of FIG. 6 example, Cres 614 may be shorted to Cmsbs 616.1, 616.2 depending on whether the MSB bit trial decision is '0' or '1' during the conversion phase. Due to the finite value of Cres 614, the ideal reference voltage Vrt−Vrb may drop to Vrp−Vrm, input signal dependency, after it's shorted with Cmsbs 616.1, 616.2.

In step 714, the ADC may convert the input signal using the reference voltage and thereby may generate raw digital output, Dout_raw. Dout_raw may contain errors due to the reference voltage errors. The conversion may be a SAR approximation conversion, pipeline conversion, etc. In step 716, Dout_raw may be captured by a digital processor. In step 718, bit decisions (k) may be extracted from Dout_raw. In step 720, non-shared sampling element effective weights may be extracted from Dout_raw.

In step 722, the reference voltage errors in Dout_raw may be corrected digitally based on the extracted information. Consider DAC 600 of FIG. 6, for example, where output nodes 3 and 4 of DAC 600 may eventually be driven to zero because of the SAR ADC negative feedback loop. Thus, based on charge conservation between the sampling and conversion phases, on both nodes 1 and 2:

$$(Vrt-Vrb)*Cres+Vip*k*Cmsb+Vim*(1-k)*Cmsb = (Vrp-Vrm)*Cres+Vrp*Cmsb; \quad (6)$$

$$(Vrb-Vrt)*Cres+Vim*k*Cmsb+Vip*(1-k)*Cmsb = (Vrm-Vrp)*Cres+Vrm*Cmsb; \quad (7)$$

where k is the MSB decision(s). In this example with 1-bit MSB, k is either 0 or 1. Therefore, the expression may be simplified to:

$$Vrp-Vrm = ((2*k-1)*Cmsb*(Vip-Vim)+2*Cres*(Vrt-Vrb))/(2*Cres+Cmsb); \quad (8)$$

Thus, the effective weight for MSB capacitor may be expressed as:

$$w\_eff[k] = (Vrp-Vrm)/(Vrt-Vrb)*(2*k-1)*Wmsb/2; \quad (9)$$

where Wmsb is the bit weight corresponding to the MSB capacitor(s). Summing that with the total effective weights of the LSB decisions may yield:

$$w\_tot = w\_eff[k] + wlsbs\_eff; \quad (10)$$

And by definition of an ADC operation, w_tot may also be expressed as:

$$w\_tot = (Vip-Vim)/(Vrt-Vrb)*Wsum/2; \quad (11)$$

where Wsum is the total weight of the reference capacitors. Equations (9), (10), and (11) correspond to equations (4), (3), and (5) respectively. Therefore, based on these equations w_tot may be expressed as:

$$w\_tot = (2*Cres*(2*k-1)*Wmsb/2+wlsbs\_eff*(2*Cres+Cmsb))/(2*Cres+Cmsb*(1-Wmsb/Wsum)); \quad (12)$$

Hence, the effective/correct digital output weight w_tot may be calculated. Note that in equation (12) only k and w_lsbs_eff are variable inputs that may be extracted from raw ADC outputs, Dout_raw. All other parameters may be constant values. Therefore, reference voltage correction Dout_correct in the form of w_tot may be calculated in the digital domain at each conversion/clock cycle. Returning to FIG. 7, Dout_correct may be outputted in step 724. Dout_correct may be free of (or have reduced) reference voltage errors.

The features of the disclosed embodiments may be implemented in hardware, software, firmware, or a combination thereof and utilized in systems, subsystems, components or subcomponents thereof. When implemented in software, the elements of the disclosed embodiments are programs or the code segments used to perform the necessary tasks. The program or code segments can be stored on machine readable storage media. The "machine readable storage media" may include any medium that can store information. Examples of a machine readable storage medium may include electronic circuits, semiconductor memory device, ROM, flash memory, erasable ROM (EROM), floppy diskette, CD-ROM, optical disk, hard disk, fiber optic medium, any electromagnetic storage device, or optical. The code segments may be downloaded via computer networks such as Internet, Intranet, etc.

Although the invention has been described above with reference to specific embodiments, the invention is not limited to the above embodiments and the specific configurations shown in the drawings. For example, some components shown may be combined with each other as one embodiment, or a component may be divided into several subcomponents, or any other known or available component may be added. The operation processes are also not limited to those shown in the examples. Those skilled in the art will appreciate that the invention may be implemented in other ways without departing from the spirit and substantive features of the invention. For example, features and embodiments described above may be combined with and without each other. The present embodiments are therefore to be considered in all respects as illustrative and not restrictive. The scope of the invention is indicated by the appended claims rather than by the foregoing description, and all changes that come within the meaning and range of equivalency of the claims are therefore intended to be embraced therein.

We claim:

1. An analog-to-digital converter (ADC) system, comprising:
    an analog circuit to receive an input signal and a reference voltage, and to convert the input signal into a raw digital output, comprising:
       at least one sampling element to sample the input signal during a sampling phase and reused to connect to the reference voltage during a conversion phase, and
       an output to output the raw digital output; and
    a digital processor to receive the raw digital output and for each clock cycle, to digitally correct reference voltage errors in the analog-to-digital conversion by extracting bit decisions for each cycle to use in the reference voltage error correction to output a corrected digital signal.

2. The ADC system of claim 1, wherein the reference voltage errors are a function of the input signal.

3. The ADC system of claim 1, wherein the reference voltage errors are a function of actual bit weights of the analog-to-digital conversion.

4. The ADC system of claim 1, wherein the at least one sampling element is a capacitor.

5. The ADC system of claim 1, wherein the at least one sampling element is part of a capacitive DAC.

6. The ADC system of claim 5, wherein the reference voltage errors are due to the capacitive DAC drawing charge from the reference voltage during the analog-to-digital conversion.

7. The ADC system of claim 1, wherein analog circuit includes a successive approximation register (SAR) ADC.

8. The ADC system of claim 7, wherein the reference voltage errors change during the analog-to-digital conversion.

9. The ADC system of claim 1, wherein the analog circuit includes a pipelined ADC.

10. A method of analog to digital conversion, comprising:
sampling an analog input signal using at least one sampling element;
connecting to a reference voltage reusing the at least one sampling element used to sample the analog input signal;
converting the analog input signal to a raw digital signal;
correcting a reference voltage error in the raw digital signal each clock cycle by extracting bit decisions of the analog input signal to raw digital signal conversions and using the extracted bit decisions in the reference voltage errors correction; and
outputting a corrected digital signal.

11. The method of claim 10, wherein the reference voltage error is a function of the input signal.

12. The method of claim 10, wherein the reference voltage error is a function of actual bit weights of the analog-to-digital conversion.

13. The method of claim 10, wherein the at least one sampling element is a capacitor.

14. The method of claim 10, wherein the at least one sampling element is part of a capacitive DAC.

15. The method of claim 10, wherein the reference voltage error is due to the capacitive DAC drawing charge from the reference voltage during the analog-to-digital conversion.

16. The method of claim 10, wherein converting the analog input signal to a raw digital signal uses SAR conversion.

17. The method of claim 16, wherein the reference voltage errors change during the analog-to-digital conversion.

18. The method of claim 10, wherein converting the analog input signal to a raw digital signal uses pipelined conversion.

19. A non-transitory machine-readable medium storing instructions adapted to be executed by a processor to perform a method comprising:
receiving a converted digital signal from an analog-to-digital converter that uses a sampling element to sample an input signal during a first phase and reuses the sampling element to connect to a reference voltage during a second phase;
extracting bit decisions from the converted digital signal; and
based on the extracted bit decisions, correcting reference voltage errors in the converted digital signal each clock cycle.

20. The non-transitory machine-readable medium of claim 19, wherein converted digital signal is a SAR converted signal.

21. The non-transitory machine-readable medium of claim 19, wherein converted digital signal is a pipelined converted signal.

22. The ADC system of claim 1, wherein the digital processor to:
determining effective weight(s) for each sampling element based on the extracted bit decisions, element weight for the sampling element, and architecture of the analog circuit;
based on the effective weights, calculating a total weight of the sampling element(s) as a function of the input signal and reference voltage;
adjusting the raw digital output based on the total weight to correct the reference voltage errors.

23. The method of claim 10, further comprising:
determining effective weight(s) for each sampling element based on the extracted bit decisions, element weight for the sampling element, and architecture of an analog to digital converter used in the conversion;
based on the effective weights, calculating a total weight of the sampling element(s) as a function of the input signal and reference voltage;
adjusting the raw digital signal based on the total weight to correct the reference voltage error.

24. The non-transitory machine-readable medium of claim 19, further comprising:
determining effective weight for the sampling element based on the extracted bit decisions, element weight for the sampling element, and architecture of the analog-to-digital converter;
based on the effective weights, calculating a total weight of the sampling element as a function of the input signal and reference voltage;
adjusting the raw digital signal based on the total weight to correct the reference voltage errors.

* * * * *